United States Patent [19]

Kroger

[11] 4,176,365
[45] Nov. 27, 1979

[54] JOSEPHSON TUNNEL JUNCTION DEVICE WITH HYDROGENATED AMORPHOUS SILICON, GERMANIUM OR SILICON-GERMANIUM ALLOY TUNNELING BARRIER

[75] Inventor: Harry Kroger, Sudbury, Mass.

[73] Assignee: Sperry Rand Corporation, New York, N.Y.

[21] Appl. No.: 904,051

[22] Filed: May 8, 1978

[51] Int. Cl.² ............................................ H01L 39/22
[52] U.S. Cl. .................................. 357/5; 357/6; 357/59; 357/2; 29/599
[58] Field of Search ...................... 357/5, 6, 59, 2; 29/599

[56] References Cited

U.S. PATENT DOCUMENTS

| 3,816,173 | 6/1974 | Eldridge | 117/217 |
| 3,852,795 | 12/1974 | Ames | 357/5 |
| 3,999,203 | 12/1976 | Lahiri | 357/5 |

OTHER PUBLICATIONS

Paul, et al., *Solid State Comm.*, vol. 20, pp. 969–972, Pergamon Press, Great Britain.
Huang et al., *IEEE Trans. on Magnetics*, vol. MAG-11, No. 2, Mar. 1975.
Cardinne, et al., *Revue de Physique Appliquee*, vol. 9, Jan. 1974, p. 167.

*Primary Examiner*—Martin H. Edlow
*Attorney, Agent, or Firm*—Howard P. Terry; Albert B. Cooper

[57] ABSTRACT

A Josephson tunnel junction device having niobium superconductive electrodes with an amorphous hydrogenated semiconductor tunnelling barrier therebetween comprised of silicon or germanium or an alloy thereof supports an unusually high critical current density. Barrier dopants provide a further increase in the critical current density. The barrier is deposited by rf-sputtering in an atmosphere containing hydrogen.

17 Claims, 4 Drawing Figures

JOSEPHSON TUNNEL JUNCTION DEVICE WITH HYDROGENATED AMORPHOUS SILICON, GERMANIUM OR SILICON-GERMANIUM ALLOY TUNNELING BARRIER

BACKGROUND OF THE INVENTION

1. Field of the Invention

The invention relates to superconductive circuits particularly with regard to a novel Josephson tunnel junction device therefor.

2. Description of the Prior Art

Superconductive Josephson memory and logic circuits are known in the art which utilize the Josephson tunnel junction as the active switching elements or gates therefor. The Josephson junction comprises two superposed layers of superconductive material with an insulator or semiconductor layer or barrier therebetween whereby Josephson tunneling current flows from one superconductive layer to the other through the barrier via the Josephson tunneling effect. With the superconductive layers connected into a superconductive loop and control lines disposed adjacent the junction the d.c. Josephson zero voltage current flowing through the device may be controlled so as to provide the necessary current steering control functions in the Josephson circuitry.

Primary objectives in the design of Josephson circuitry are to minimize the surface area required for the circuit components such as the memory and logic superconductive loops and to provide fabrication parameters that result in relatively simple and non-critical manufacturing procedures that reliably produce high yield circuits.

One of the pertinent parameters in designing Josephson storage loops of minimum area is the loop inductance. The value of inductance is a direct function of loop size. The smaller the loop the lower will be its inductance value. Another factor influencing loop size is the quantum mechanical effect which is an inherent property of superconductive circuits. Magnetic flux stored in a loop is necessarily quantized in magnetic flux units determined by Planck's constant and the charge of the electron. Only integral numbers of flux quanta can be stored in a loop. Thus the circulating loop supercurrent related to the loop flux is necessarily limited to quantized values thereof.

The magnetic flux threading a superconductive loop is equal to the product of the circulating loop supercurrent and the loop inductance. Since the minimum amount of flux that can be stored in a superconductive loop is one flux quantum, the minimum circulating supercurrent that can flow in a loop of given inductance is the quantized current value corresponding thereto. It is generally desirable for reliable switching to store a plurality of flux quanta with the corresponding quantized supercurrent circulating in the loop although circuits may be utilized that store one flux quantum. It is appreciated, therefore, that the smaller the loop size, and hence the smaller the inductance value, the greater must be the value of the circulating supercurrent to provide storage of reasonable numbers of flux quanta.

The supercurrent circulating in the loop passes through and must be supported by the Josephson tunnel junction switches utilized therein. For reasonable barrier thicknesses and conventional deposited barrier materials, present day Josephson tunnel junction switches provide limited current densities of between tens of milliamperes per square centimeter to several hundred amperes per square centimeter. With such current densities, in order to support the required circulating supercurrents in loops of reasonable dimensions, unduly large junction areas are required to the extent that the size of area required for the junction may approach the total size allocated for the loop with its tunnel junction switches, otherwise extremely thin oxide barriers must be used to support high critical current densities.

Although critical current density increases with decreasing thickness of the barrier, thin barriers are undesirable since they tend to be fragile thus complicating fabrication procedures as well as tending to provide non-reproducible junction properties. With such fragile barriers only gentle deposition techniques may be utilized such as evaporative deposition for forming the upper superconductive layer in the sandwiched construction of the junction devices. With such thin layers, sputter deposition tends to be too violent a process, often consuming the thin layers or causing short circuits therethrough. However, when utilizing evaporative deposition, in order to obtain high superconductive transition temperatures for desirable superconductive materials, ultra high vacuum systems are required which tend to be expensive and critical in operation. For example, although niobium layers having a high transition temperature may be deposited by sputtering, at a background partial pressure of approximately $10^{-7}$ Torr of oxygen, evaporative deposition of the material to obtain a high transition temperature requires a background pressure of approximately $10^{-10}$ Torr.

The prior art has contemplated utilizing semiconductor materials as the barrier in Josephson tunnel junctions. It is expected that reasonably thin single crystal silicon may be utilized to achieve high current densities. In order to use such a barrier, complex thinning processes are required to reduce the thickness of the bulk silicon material to thicknesses usable in tunneling barriers. Once such thinning is achieved, patterning and deposition are required on both sides of the silicon wafer in order to provide the tunnel junction structure of superconductor-semi-conductor-superconductor. Thus fabrication techniques necessarily more complex than those utilized for one sided lithographic patterning and deposition are required.

In order to achieve optimum circuit performance it is desirable that the Josephson circuit loops, including the tunnel junctions therefor, form critically damped circuits. In order that a loop be critically damped it is required that $\sqrt{L/C}$ is greater than a critical resistance, where L is primarily the loop inductance and C is primarily the capacitance of the Josephson tunnel junction. As discussed above, it is desirable to maintain a small loop area to minimize the size of the Josephson circuits and, as discussed, the requirement of small loop size limits the magnitude of the loop inductance. Thus in order to achieve critical damping with small sized loops it is necessary to minimize the device capacitance. On the other hand, as discussed above, it is generally required to utilize relatively thin barriers to achieve the necessary supercurrent for the loop operation. This has a tendency to increase the device capacitance since capacitance varies inversely as the thickness of the barrier. Thus the prior art Josephson junction devices suffer from the disadvantage that a compromise must be effected between barrier thickness and available supercurrent, which compromise may often only be effected by the use of a relatively large area junction. Additionally the device capacitance varies directly with the dielectric constant of the barrier material. The dielectric constant of many prior art barrier materials are unduly high, therefore resulting in undesirably large device capacitance. For example, niobium oxide ($Nb_2O_5$) has a dielectric constant of 30 which results in an undesirably large capacitance per unit area of barrier.

SUMMARY OF THE INVENTION

The invention overcomes the disadvantages of the prior art by utilizing a barrier material that provides unusually high current density. Other factors being equal, the present invention provides three to four times the current density than do prior art barriers. Current densities of 2,000 to 4,000 amperes per square centimeters are realizable utilizing the present invention.

The present invention comprises a Josephson tunnel junction device having first and second superposed superconductive layers with a tunneling barrier therebetween, the barrier comprising a hydrogenated amorphous semiconductor material selected from the group consisting of silicon, germanium and alloys thereof.

Further improvement is effected by doping the hydrogenated amorphous semiconductor barrier.

By utilizing the invention, which provides the unusually high current density, small Josephson superconducting loops utilizing small area Josephson tunnel junctions having barriers of significant thickness are readily achieved with reproducible properties utilizing relatively non-critical fabrication procedures.

DESCRIPTION OF THE PREFERRED EMBODIMENT

Figure 1:
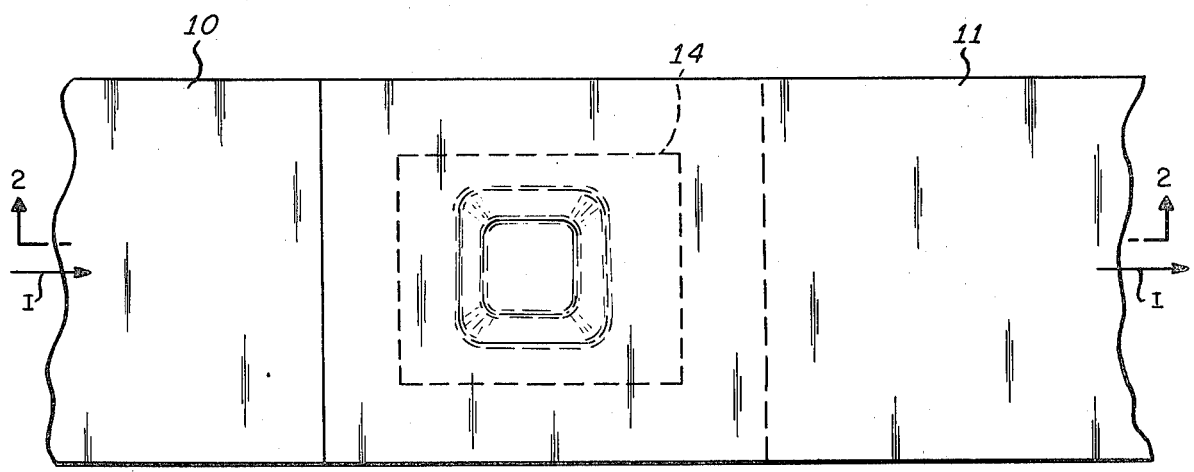
FIG. 1 is a top view of a Josephson tunnel junction device in accordance with the present invention.
Figure 2:
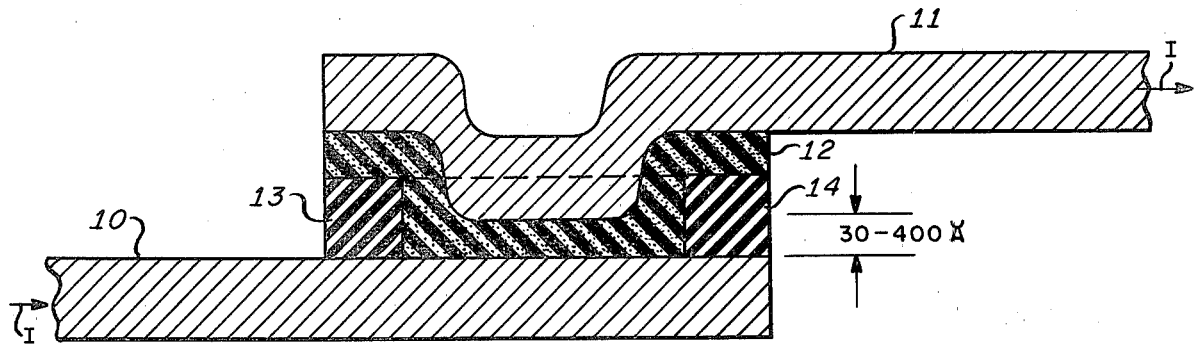
FIG. 2 is a side elevation view of a cross-section of the device of FIG. 1 taken along line 2—2.

Referring to FIGS. 1 and 2, a Josephson tunnel junction device in accordance with the present invention is illustrated. FIG. 1 is a top view thereof and FIG. 2 is a cross-section of the device taken along the line 2—2. The tunnel junction device consists of first and second superposed superconductive layers 10 and 11 with a tunneling barrier 12 therebetween. In the preferred embodiment of the invention the superconductive material of the layers 10 and 11 is preferably a refractory metal such as niobium (Nb). In accordance with the invention the tunneling barrier 12 is comprised of amorphous hydrogenated silicon (a-Si) or amorphous hydrogenated germanium (a-Ge) or possibly an alloy thereof. The barrier material may also be doped with n-or p-type material. A preferred construction of the Josephson junction includes an insulator layer 13 with a rectangular opening 14 therein to define accurately the boundaries of the effective tunneling barrier layer 12. The effective Josephson tunneling barrier is preferably 30–400 Angstrom units thick. If utilized the dopant may, for example, be phosphorous (n-type) or boron (p-type). The amorphous silicon or germanium barrier 12 is preferably deposited by sputtering in a partial hydrogen atmosphere thereby hydrogenating the layer.

The device may be fabricated with or without the insulator layer 12 with the hole 14 therethrough. This portion of the device defines the tunneling barrier geometry resulting in enhanced reproducibility of device parameters. The layer 13 comprises an insulator such as, for example, silicon dioxide ($SiO_2$).

By utilizing the amorphous hydrogenated silicon, amorphous hydrogenated germanium or amorphous hydrogenated silicon-germanium alloy as the tunneling barrier in a Josephson tunnel junction device, an unexpectedly large increase in Josephson current density was obtained compared to non-hydrogenated barriers of similar thicknesses. For example, everything else being equal, an amorphous unhydrogenated (pure) silicon barrier 30–35 Angstrom units thick passed a maximum Josephson current density of 120 amperes per square centimeter. A phosphorous doped hydrogenated amorphous silicon barrier, in accordance with the invention, which was 60 Angstrom units thick supported a Josephson current density of 2000–4000 amperes per square centimeter. This is an unexpected improvement in Josephson current density over that which has been heretofore provided in the prior art. The major increase in current density is attributed to the hydrogenation. The effect of the dopant is typically to increase the Josephson current density by about 20% or less over that which can be obtained by the hydrogenation alone. The effect of the hydrogenation of the silicon or germanium is to increase the maximum obtainable Josephson current density by a factor of 3 to 4 compared to that obtainable from pure amorphous silicon or germanium of the same barrier thickness.

It is believed that the unexpected improvement in Josephson current density occurs because the hydrogenated silicon is, in fact, an amorphous silicon-hydrogen compound (which may be considered as silicon hydride) with electron affinity different from that of pure amorphous slicon. An increase in electron affinity results in a lowering of tunneling barrier height. The surface state density of hydrogenated silicon is believed to be different from that of conventionally produced amorphous silicon and therefore may result in different band bending within the semiconductor material at the superconductor-semiconductor interfact, thus altering the tunnel barrier with respect to electrons. The hydrogenation significantly reduces the pseudogap state density and the dielectric constant of the semiconductor material. The same considerations apply to the use of germanium and silicon-germanium alloy.

The optional doping of the semiconductor, preferably with phosphorous, arsenic or antimony or any other suitable dopant, which provides the still further increase in Josephson current density discussed above, is rendered feasible by sputtering the amorphous silicon layer in the partial hydrogen atmosphere. Not only does the hydrogenation result in the remarkable increase in Josephson current densities discussed above but it additionally reduces the pseudogap defect states permitting the introduction of the dopant donor or acceptor states. Thus the hydrogenation provides the additional benefit of permitting successful doping of the barrier material.

It will be appreciated that in addition to the p-type dopants discussed above, n-type dopants may also be utilized in the invention. The addition of n-type dopants will move the Fermi level of the semiconductor closer to the energy level of the condution band of the semiconductor. For sufficiently heavy doping the Fermi level of the superconductor-semiconductor-superconductor sandwich will be aligned. The resulting lower barrier height present to the electrons of the metal will increase their tunneling probability.

Specifically, the amorphous hydrogenated silicon layer 12 was deposited by rf diode sputtering apparatus utilizing 100 watts of input power applied to a six inch diameter target. The sputter deposition was performed in a gas mixture atmosphere comprising 4 atomic percent hydrogen and 96 atomic percent argon at a pressure of 20 millitorr. The silicon was deposited at a rate of 28-33 Angstrom units per minute.

Doping was achieved by the addition of phospene to produce phosphorous doping. The concentration of phospene in the range of 1000-2000 parts per million of total inlet gas has been utilized to achieve the doping. As discussed above, the addition of dopants which are electrically active requires the use of hydrogen in the range of several percent added to the usual argon sputtering atmosphere.

Details of rf sputter deposition procedures of amorphous doped hydrogenated germanium and silicon are discussed in *Solid State Communications*, Volume 20, pages 969-972, Pergamon Press, Great Britain (1976) in an article entitled "Doping, Schottky Barrier and P-N Junction Formation In Amorphous Germanium and Silicon by RF Sputtering" by W. Paul et al.

It will be appreciated that none of the above parameter values are critical, wide variations in ranges of these parameter values being usable in practicing the invention. For example, it is believed that percentages of hydrogen in the gas mixture may be as low as 0.1 atomic percent and as high as 10 atomic percent to provide satisfactory devices. Similarly, the dopant gas may be introduced in as low a concentration as ten parts per million and in as high a concentration as 5000 parts per million of total inlet gas. With respect to the sputtering power utilized, lower power densities than the 100 watts with respect to a 6 inch diameter target, as discussed above, may be utilized providing the input power is sufficient to maintain the rf plasma. Power density higher by a factor of 5 to 10 with respect to the 100 watts and 6 inch diameter target discussed may be utilized while still maintaining control of the deposition rate.

Although the hydrogen-argon gas mixture was described at a pressure of 20 millitorr, it will be appreciated that this pressure is a matter of convenience. Any pressure suitable to ignite and maintain a plasma may be utilized.

Figure 3:
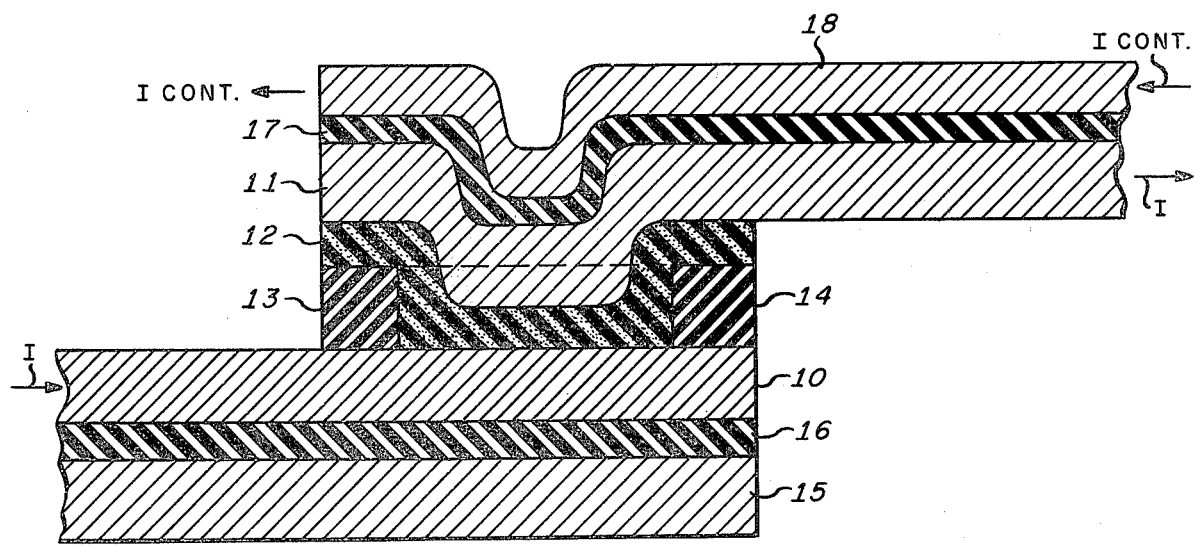
FIG. 3 is a side elevation view of the Josephson tunnel junction of the present invention illustrating further details thereof.

Referring to FIG. 3 in which like reference numerals indicate like components with respect to FIG. 2, a cross-sectional elevation view of the Josephson junction device in accordance with the invention is illustrated depicting further details thereof in a practical environment. As is appreciated in the art, the Josephson tunnel junction may be utilized as the active switching element in a Josephson logic or memory circuit comprised of microwave strip transmission lines. The circuit, including the active devices, may be fabricated on a superconductive ground plane 15 with an insulator layer 16 deposited thereon. The elements 10-14 are then formed on the insulator layer 16. A further insulator layer 17 is deposited over the superconductive layer 11 and a control line 18 is deposited thereover to provide a control magnetic field for the switching device. Supercurrent I flowing through the lower superconductive layer 10, via tunneling current through the semiconductor barrier 12 and then through the superconductive layer 11 is controlled by the magnetic field generated by the control current $I_{cont}$ applied to the line 18. The control current provides the switching function of the active device by controlling the Josephson tunneling current flowing through the barrier 12.

It will be appreciated that the device of the present invention may be fabricated utilizing only refractory superconductors, semiconductors and insulators. For example, all of the superconductive layers 10, 11, 15 and 18 may comprise niobium with the insulator layers 13, 16 and 17 comprising, for example, silicon oxide or silicon dioxide.

A method that may be utilized in fabricating a superconductive circuit utilizing the Josephson tunnel junction device as the active switches comprises the following steps.

(1) Depositing niobium ground plane 15 by sputtering 1000-5000 Angstrom units thick on oxided silicon substrate.

(2) Depositing silicon dioxide ($SiO_2$) or amorphous silicon (1000-20,000 Angstrom units thick) microwave strip transmission line dielectric layer 16 by sputtering.

(3) Utilizing standard photoresistive procedures to pattern and etch the insulator layer 16 to expose the ground plane 15 for effecting electrical connections at required points to circuit patterns which will subsequently be deposited.

(4) Depositing 3000 Angstrom units of niobium.

(5) Utilizing standard photoresistive procedures and chemical, dry chemical or sputter etching to pattern the layer of niobium deposited in step (4) to form the desired pattern of lower superconductive circuit islands. This layer of superconductive circuit islands includes superconductive layer 10.

(6) Depositing a layer of silicon dioxide ($SiO_2$) 1000-5000 Angstrom units thick by sputtering. This layer includes the insulator layer 13.

(7) Forming the openings 14 by removing the unwanted silicon dioxide by standard photoresistive and etching procedures. The barrier interface on the layer 10 is exposed.

(8) Depositing a layer of amorphous silicon (a-Si) or amorphous (a-Ge) or an amorphous alloy thereof 30-400 Angstrom units thick by rf diode sputter deposition in a partial hydrogen atmosphere. The semiconductor layer may be doped during this step by the addition of phospene to the sputtering atmosphere. This deposited layer includes the barrier 12.

(9) Depositing a layer of niobium 3000 Angstrom units thick by sputtering. This forms the upper superconductive layer 11.

(10) Removing the unwanted portions of the niobium layer deposited in step (9) by standard photoresistive and etching procedures.

(11) Depositing the insulator layer 17 by sputtering 3000 Angstrom units of silicon dioxide or evaporating silicon oxide.

(12) Removing unwanted areas of the insulator layer 17 by standard photoresistive and etching procedures.

(13) Sputter depositing the upper niobium layer forming the control lines 18. The layer deposited in this step can also function to form any required interconnections between the microwave strip transmission lines.

Uniformity of device parameters is enhanced by utilizing as in situ sputter etching of the surface of the lower niobium layer 10 immediately preceding the deposition of the amorphous silicon layer 12. This sputter etching cleaning step is performed in the same pump down of the vacuum system as is utilized in the sputter deposition of the layer 12 so that the surface of the niobium layer 10 is not exposed to the atmosphere between cleaning and deposition. This procedure ensures that the surface of the lower niobium layer 10 is covered by only an extremely thin oxide layer (0–5 Angstrom units) which forms between the end of the sputter etching procedure and before commencement of the semiconductor deposition. Background pressures of $10^{-7}$ Torr or less should be utilized prior to introducing the argon-hydrogen gas to minimize this oxide formation. This sputter etching cleaning step may also be utilized when depositing the insulator layers 16 and 17 on the niobium layers 15 and 11 respectively.

It may also be desirable to perform an oxidation step after deposition of the layer 12 prior to deposition of the upper niobium layer 11. This is a known procedure which fills in pin holes in the semiconductor layer 12 thus prohibiting the formation of unwanted weak-links whose presence would alter the threshold curve of the device. The oxidation may be performed in pure oxygen at 130° C. for 10 minutes. It is believed that this step may be eliminated without a significant degradation in device yield.

It will be appreciated that the above described method is exemplary, other methods being usable to fabricate superconductive circuits utilizing Josephson tunnel junctions with the novel barrier materials in accordance with the invention as the active switches therefor. It will furthermore be appreciated that the above described materials for fabricating the elements 10, 11, 13 and 15–18 are exemplary, other materials being suitable for achieving the same effect. Other suitable superconductive metals may be utilized in place of the niobium and other suitable insulating materials for the layers 13, 16 and 17 may be utilized.

Specifically, the barrier of the present invention permits a refractory metal such as niobium to be utilized for both the upper and lower superconductive layers 10 and 11. Thus soft metals such as lead or lead alloys need not be utilized in fabricating the Josephson tunnel junction device. Since the novel tunneling barrier of the present invention comprises silicon or germanium or an alloy thereof, which are refractory materials, it is appreciated that Josephson tunnel junction devices fabricated in accordance with the present invention, may utilize only refractory materials. Thus, it is believed that devices fabricated in accordance with the present invention may be processed at temperatures above 200° C. without significantly affecting device performance. Josephson logic and memory circuits utilizing the Josephson junction devices in accordance with the invention may be produced with ease of reliable fabrication and which will exhibit significantly greater device recyclability between room temperature and cryogenic temperatures than prior art devices. Additionally, compound refractory superconductive materials such as niobium nitride (NbN), niobium-tin ($Nb_3Sn$) or niobium-germanium ($Nb_3Ge$) may be utilized for the superconductive layers 10 and 11 as well as for the ground plane 15 and the control lines 18. These materials have a higher superconductive transition temperature than does niobium and may be utilized for this advantage.

Figure 4:
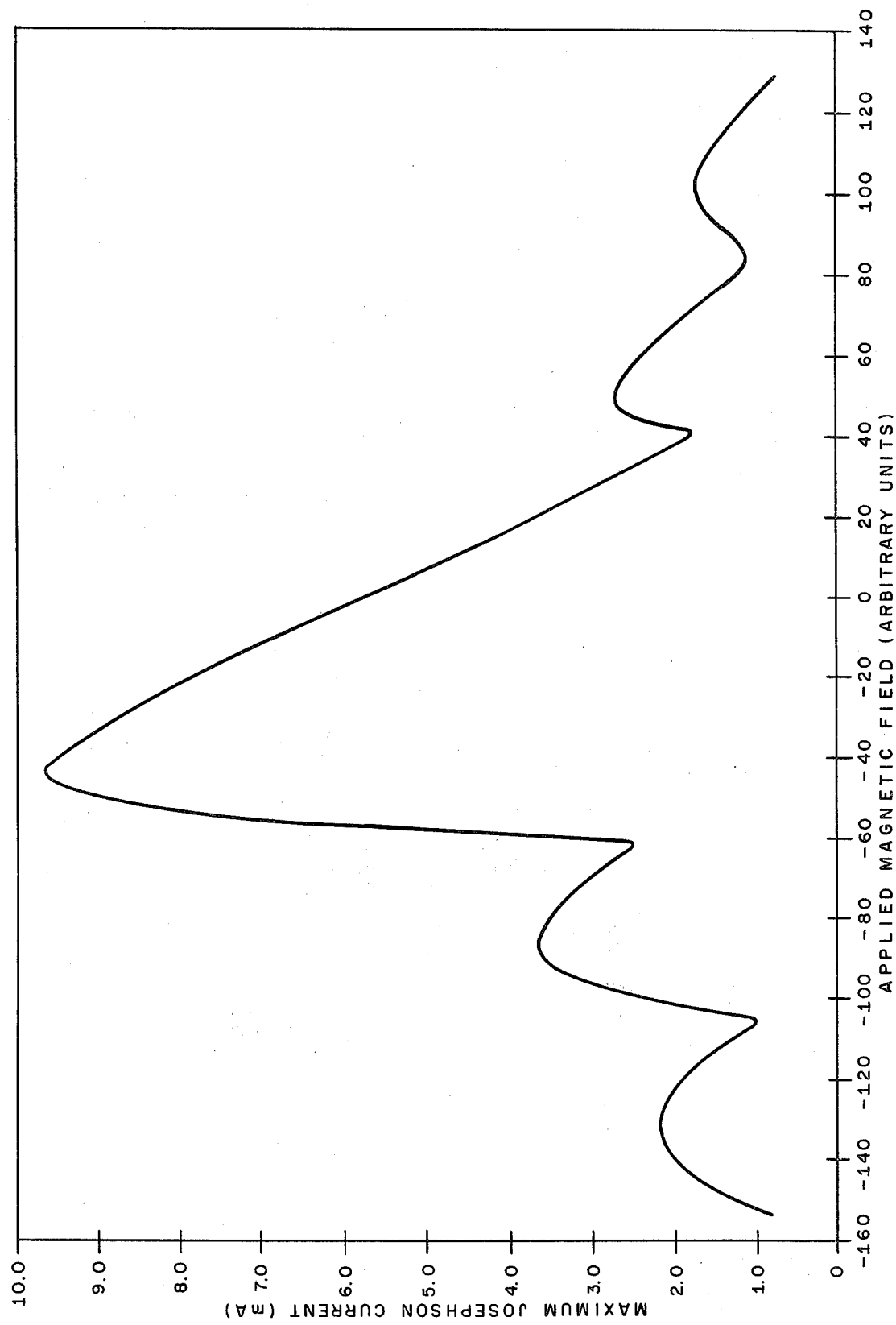
FIG. 4 is a threshold curve of critical current versus applied magnetic field for the Josephson tunnel junction device of the present invention.

Referring to FIG. 4, a threshold curve of maximum critical current versus applied magnetic field for the hydrogenated semiconductor barrier junction devices is illustrated. The curve represents data for a phosphorous doped hydrogenated amorphous silicon barrier approximately 120 Angstrom units thick. The data indicates qualitatively that there are no gross inhomogeneities in the barrier indicating that the sputtered semiconductor barrier layers can be deposited sufficiently uniformly to provide commercially reproducible devices. The current density obtained with the thick barrier described was 300 amperes per square centimeter.

As discussed above, the unusually high critical current density supported by the barrier of the present invention permits utilization of thicker barriers than would otherwise be possible utilizing prior art materials. The thicker barrier thus permitted overcomes the numerous disadvantages of prior art Josephson tunnel junction devices discussed hereinabove. Thicker barriers tend to provide devices with acceptably reproducible properties such as reproducible Josephson current therefore facilitating utilizing the devices in commercially manufactured large scale integrated circuits (LSI). For the reasons given above the significantly larger Josephson current density supported by devices utilizing the present invention permit smaller superconductive loops in which the devices are utilized as active elements thus providing significantly higher data packing density in memory applications as well as smaller Josephson memory and logic circuits. Critical damping utilizing smaller loops is facilitated since the thicker barriers provide lower device capacitance. Additionally, the hydrogenation utilized to provide the barrier of the present invention tends to reduce the dielectric constant of the material. For example, the dielectric constant for unhydrogenated amorphous silicon is approximately 11 and is approximately 6 to 9 for hydrogenated amorphous silicon.

Another advantage accruing from the use of the thicker barriers rendered feasible by the present invention is that the layer 11 which may be niobium or other refractory metal may be sputter deposited over the barrier layer 12 without exercising extraordinary precautions to prevent destruction of the barrier layer or to prevent short circuits therethrough. The disadvantages exist in the prior art since the thinner barriers conventionally required tend to be destroyed by the sputtering process. In order to deposit niobium on a thin barrier to provide an operable device, evaporative deposition in an ultra high vacuum system must be utilized to obtain niobium with a reasonably high superconductive transition temperature. Ultra high vacuum systems operate with $10^{-9}$ to $10^{-10}$ Torr background pressure whereas rf sputter deposition apparatus normally utilize background pressures of approximately $10^{-7}$ Torr. The sputter deposited thick barrier device tends to be more durable and less fragile than the thinner barrier prior art junctions.

The sputter deposition utilized in forming the layers of the Josephson junction device of the present invention is advantageous relative to the prior art process of thinning single crystal silicon from a macroscopically thick wafer down to hundreds or thousands of Angstrom units. In the prior art, lithographic patterns were required on both sides of the thinned wafer to form the superconductive layers. In the fabrication techniques recommended for the present invention lithographic patterns are formed on only one side of the substrate.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A Josephson tunnel junction device comprising
first and second layers of superconductive material superposed with respect to each other, and
a barrier layer superposed between said first and second superconductive layers whereby Josephson tunneling current can flow therethrough between said superconductive layers,
said barrier layer comprised of hydrogenated amorphous semiconductor material selected from the group consisting of silicon, germanium and alloys thereof.

2. The device of claim 1 in which said barrier layer comprises said hydrogenated amorphous semiconductor deposited on said first superconductive layer by sputter deposition in a partial hydrogen atmosphere.

3. The device of claim 1 in which said barrier layer comprises said hydrogenated amorphous semiconductor deposited on said first semiconductor layer by rf sputter deposition in a partial hydrogen atmosphere.

4. The device of claim 1 in which said barrier layer comprises said hydrogenated amorphous semiconductor deposited on said first superconductive layer by rf diode sputter deposition in a partial hydrogen atmosphere.

5. The device of claim 1 in which said barrier layer comprises doped hydrogenated amorphous semiconductor selected from the group consisting of silicon, germanium and alloys thereof.

6. The device of claim 5 in which said barrier layer is doped by a dopant selected from the group consisting of phosphorous, arsenic and antimony.

7. The device of claim 1 further including an insulator layer disposed between said first and second superconductive layers having at least one opening therethrough for defining the Josephson tunneling barrier area of said device.

8. The device of claim 7 in which said opening is quadralaterally shaped.

9. The device of claim 8 in which said opening is rectangularly shaped.

10. The device of claim 7 in which said opening is circularly shaped.

11. The device of claim 7 in which said opening has an oval shape.

12. The device of claim 1 further including control line means proximate said superconductive layers and electrically insulated therefrom for providing a control magnetic field to said barrier layer thereby controlling said Josephson tunneling current flowing therethrough.

13. The device of claim 12 further including superconductive ground plane means with said first and second superconductive layers superposed between said control line means and said ground plane means.

14. A Josephson tunnel junction device for use as a switch in superconductive circuits comprising
a superconductive ground plane,
a dielectric layer deposited on said ground plane,
a first layer of superconductive material deposited on said dielectric layer,
a first insulator layer deposited on said first superconductive layer with at least one opening therethrough for defining a Josephson tunneling barrier area,
a layer of hydrogenated amorphous semiconductor material deposited on said first insulator layer and into said opening,
said semiconductor selected from the group consisting of silicon, germanium and alloys thereof,
a second layer of superconductive material deposited on said layer of semiconductor material,
said semiconductor material deposited in said opening forming a Josephson tunneling barrier between said first and second superconductive layers whereby Josephson tunneling current can flow therethrough between said superconductive layers,
a second insulator layer deposited on said second superconductive layer, and
control line means deposited on said second insulator layer for providing a control magnetic field to said barrier thereby controlling the Josephson tunneling current flowing between said superconductive layers through said barrier.

15. A method of manufacturing the device of claim 14 comprising the steps of
depositing a dielectric layer on a superconductive ground plane,
depositing a first layer of superconductive material on said dielectric layer,
depositing a first insulator layer on said first superconductive layer,
forming at least one opening through said first insulator layer,
sputter depositing a layer of hydrogenated amorphous semiconductor on said first insulator layer in a partial hydrogen atmosphere thereby depositing said hydrogenated amorphous semiconductor material in said opening,
said semiconductor material selected from the group consisting of silicon, germanium and alloys thereof,
depositing a second layer of superconductive material on said layer of semiconductor material,
said semiconductor material within said opening forming a Josephson tunneling barrier between said first and second superconductive layers,
depositing a second insulator layer on said second superconductive layer and
depositing superconductive control line means on said second insulator layer.

16. The method of claim 15 further including the step of doping said semiconductor material during said sputter deposition thereof.

17. The method of claim 15 further including the step of sputter etching said first superconductive layer in the same vacuum system pump down in which said semiconductor layer is deposited.

* * * * *